(12) United States Patent
Ruzic et al.

(10) Patent No.: US 7,652,272 B2
(45) Date of Patent: Jan. 26, 2010

(54) PLASMA-BASED DEBRIS MITIGATION FOR EXTREME ULTRAVIOLET (EUV) LIGHT SOURCE

(75) Inventors: David Ruzic, Urbana, IL (US); Robert Bristol, Portland, OR (US); Bryan J. Rice, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 247 days.

(21) Appl. No.: 11/762,011

(22) Filed: Jun. 12, 2007

(65) Prior Publication Data

US 2007/0235666 A1 Oct. 11, 2007

Related U.S. Application Data

(62) Division of application No. 10/628,129, filed on Jul. 24, 2003, now Pat. No. 7,230,258.

(51) Int. Cl.
    *H01J 35/00* (2006.01)
(52) U.S. Cl. .......... 250/504 R; 355/30; 355/76
(58) Field of Classification Search .......... 250/504 R
    See application file for complete search history.

(56) References Cited

U.S. PATENT DOCUMENTS

| | | | |
|---|---|---|---|
| 4,837,794 A | 6/1989 | Riordan et al. | |
| 5,194,731 A | 3/1993 | Turner | |
| 5,432,831 A | 7/1995 | Nagai et al. | |
| 5,533,083 A | 7/1996 | Nagai et al. | |
| 5,811,022 A | 9/1998 | Savas et al. | |
| 6,359,969 B1 | 3/2002 | Shmaenok | |
| 6,421,421 B1 | 7/2002 | McGeoch | |
| 6,474,258 B2 * | 11/2002 | Brcka | 118/723 I |
| 6,590,959 B2 | 7/2003 | Kandaka et al. | |
| 6,665,326 B2 | 12/2003 | Kusunose | |
| 6,753,941 B2 | 6/2004 | Visser | |
| 6,762,424 B2 | 7/2004 | Wester | |
| 6,972,421 B2 * | 12/2005 | Melnychuk et al. | 250/504 R |
| 7,136,141 B2 * | 11/2006 | Bakker | 355/30 |
| 7,230,258 B2 | 6/2007 | Ruzic et al. | |
| 2003/0071979 A1 | 4/2003 | Visser | |
| 2004/0219728 A1 | 11/2004 | Kandaka | |
| 2005/0016679 A1 | 1/2005 | Ruzic et al. | |

* cited by examiner

*Primary Examiner*—David A. Vanore
*Assistant Examiner*—Phillip A. Johnston
(74) *Attorney, Agent, or Firm*—Fish & Richardson P.C.

(57) ABSTRACT

A light source chamber in an Extreme Ultraviolet (EUV) lithography system may include a secondary plasma to ionize debris particles created by the light source and a foil trap to trap the ionize particles to avoid contamination of the collector optics in the chamber.

32 Claims, 3 Drawing Sheets

PLASMA-BASED DEBRIS MITIGATION FOR EXTREME ULTRAVIOLET (EUV) LIGHT SOURCE

CROSS-REFERENCE TO RELATED APPLICATIONS

This application is a divisional application of and claims priority to U.S. patent application Ser. No. 10/628,129, filed Jul. 24, 2003.

BACKGROUND

Lithography is used in the fabrication of semiconductor devices. In lithography, a light-sensitive material, called a "photoresist", coats a wafer substrate, such as silicon. The photoresist may be exposed to light reflected from a mask to reproduce an image of the mask that is used to define a pattern on the wafer. When the wafer and mask are illuminated, the photoresist undergoes chemical reactions and is then developed to produce a replicated pattern of the mask on the wafer.

Extreme Ultraviolet (EUV) a promising future lithography techniques. EUV light may be produced using a small, hot plasma which will efficiently radiate at a desired wavelength, e.g., in a range of from 11 nm to 15 nm. The plasma may be created in a vacuum chamber, typically by driving a pulsed electrical discharge through the target material, or by focusing a pulsed laser beam onto the target material. The light produced by the plasma is then collected by nearby mirrors and sent downstream to the rest of the lithography tool.

The hot plasma tends to erode materials nearby, e.g., the electrodes in electric-discharge sources or components of the gas delivery system in laser-produced plasmas. The eroded material may coat the collector optics, resulting in a loss of reflectivity and reducing the amount of light available for lithography.

DETAILED DESCRIPTION

Figure 1:
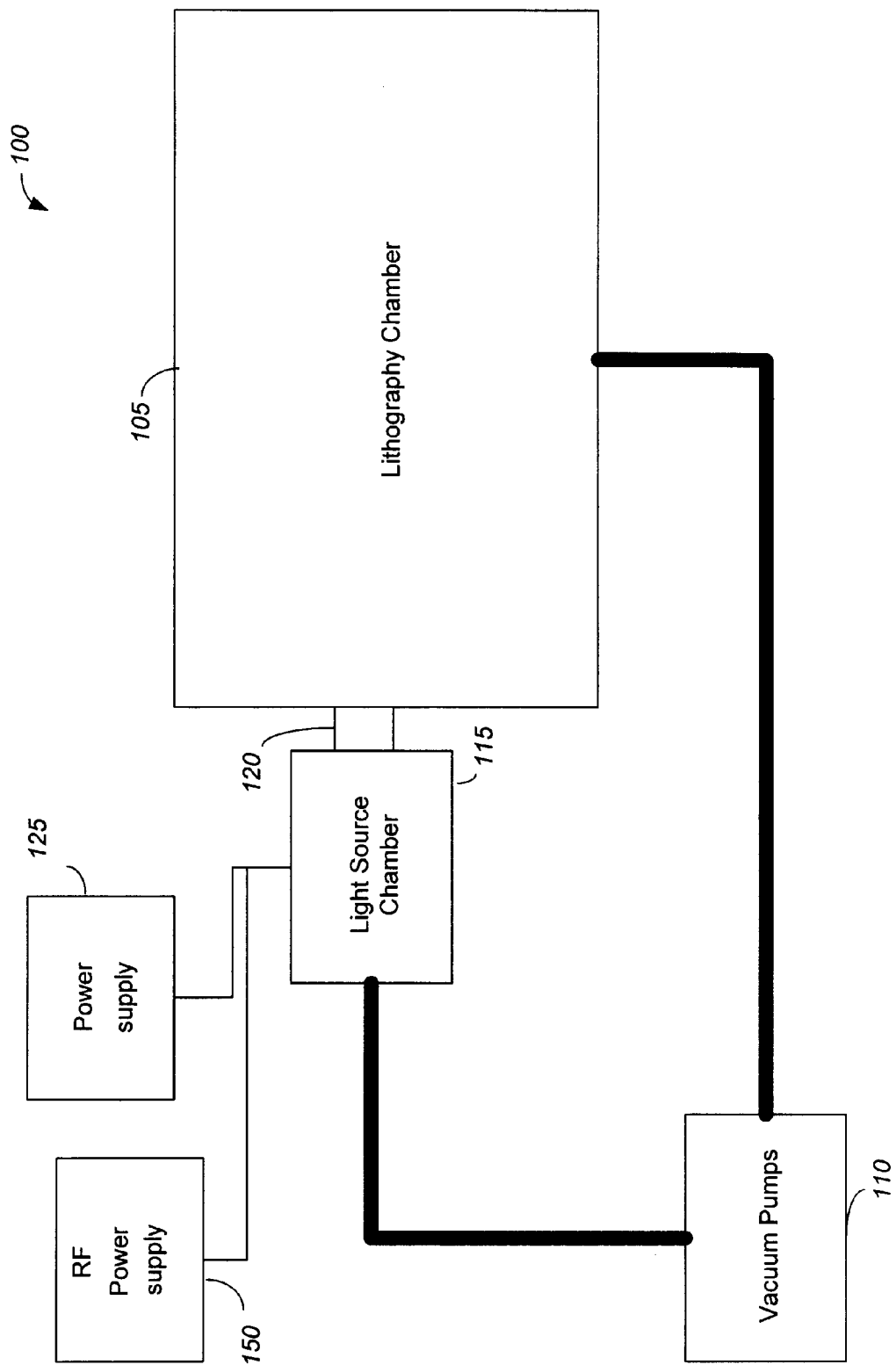
FIG. 1 shows a lithography system according to an embodiment of the invention.

FIG. 1 shows a lithography system 100. A wafer, coated with a light sensitive coating, and a mask are placed in a lithography chamber 105. The pressure in the lithography chamber may be reduced to a near vacuum environment by vacuum pumps 110. A light source chamber 115, which houses a light source, is connected to the lithography chamber 105. The pressure in the light source chamber may also be reduced to a near vacuum environment by the vacuum pumps 110. The light source chamber and lithography chamber may be separated by a valve 120 which may be used to isolate the chambers. This allows for different environments within the different chambers.

The light source chamber 115 may be an EUV chamber, which houses an EUV light source. A power supply 125 is connected to the EUV chamber to supply energy for creating an EUV photon emitting plasma, which provides EUV light for lithography. The EUV light may have a wavelength in a range of 11 nm to 15 nm, e.g., 13.5 nm. The source may be a plasma light source, e.g., a laser plasma source or a pinch plasma source. Plasma-producing components, e.g., electrodes, in the EUV source may excite a gas, e.g., Xenon, to produce EUV radiation. The EUV chamber may be evacuated by the vacuum pumps 110.

Figure 2:
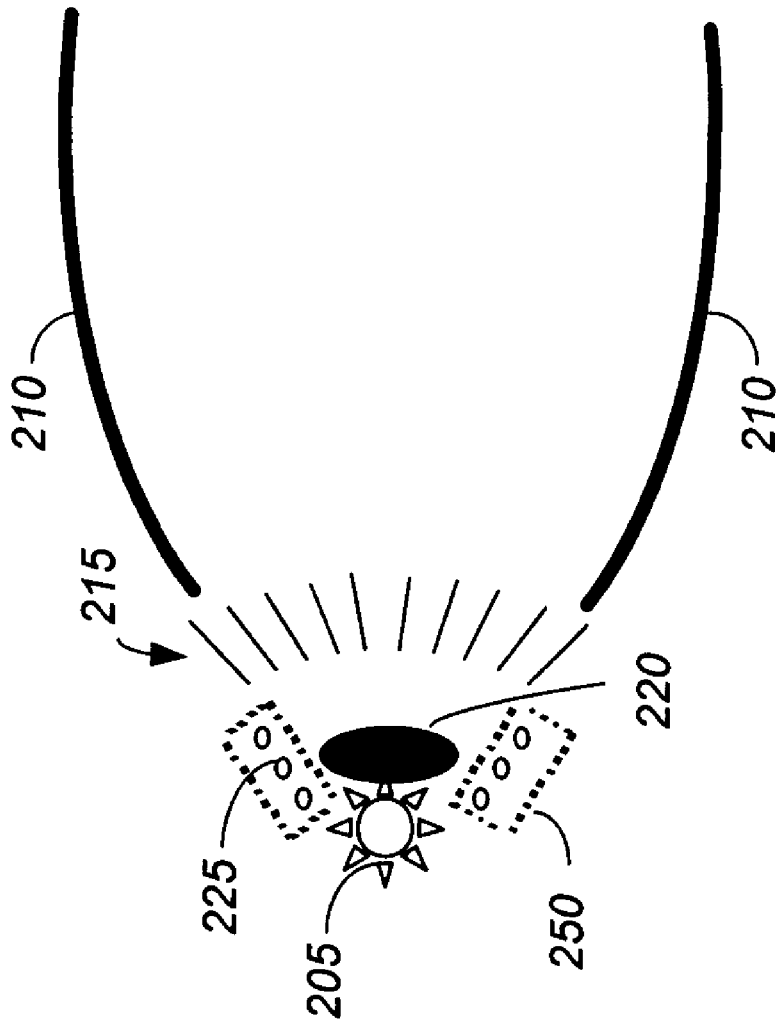
FIG. 2 shows components in a light source chamber according to an embodiment of the invention.

FIG. 2 shows components in a light source chamber according to an embodiment of the invention. The light source 205 and collector mirrors 210 for collecting and directing the light for use in the lithography chamber 105 are inside the EUV chamber.

Tungsten (W) or other refractory metal or alloy of same may be used for components in the EUV source because it is relatively resistant to plasma erosion. However, plasma-erosion may still occur, and the debris produced by the erosion may be deposited on the collector mirrors 210. Debris may be produced from other sources, e.g., the walls of the chamber. Debris particles may coat the collector mirrors, resulting in a loss of reflectivity. Fast atoms produced by the electric discharge (e.g., Xe, Li, Sn, or In) may sputter away part of the collector mirror surfaces, further reducing reflectivity.

Debris-contaminant "foil traps", e.g., foil elements in a collimator-type geometry 215, may be positioned between the source 205 and the collector mirrors 210. The foil elements may be small, thin foils spaced apart from each other by, e.g., 1 mm and spaced apart from the source by, e.g., 10-20 mm. Typically, the debris particles travel in a jagged path characteristic of Brownian motion. This path makes the debris particles susceptible to striking, and being captured by, the foil traps.

In an embodiment, a relatively low-energy secondary plasma 220 may be created between the EUV source 205 and the foil traps 215. The secondary plasma may ionize debris particles and Xenon atoms. Electrical and magnetic forces may then be provided to effect the motion of the particles more strongly toward the foil traps. An electric field which produces such forces may be created by, e.g., alternating the potential of the foil traps themselves. The ionized Xenon atoms and debris particles are drawn to the foil traps. As a result, less debris reaches collector mirrors.

Typically, the gas densities in the EUV chamber are high enough that even though debris particles may be initially charged when created near the source plasma, many quickly become neutralized.

A plasma source may be used to generate the secondary plasma 220. For example, in the embodiment shown in FIG. 2, an antenna (e.g., a coil) 225, with a radio frequency (RF) power supply 150 (FIG. 1) to supply power to the coil. Other plasma sources may include, e.g., a helicon or ECR plasma source, DC glow discharge, or capacitive plate system.

The plasma source may include "Faraday shields" 250 or other means to lessen the voltage on the coil itself, thereby minimizing sputtering of the coil.

The timing to create the secondary plasma and ionize the particles may be very short, e.g., on the order of tens of microseconds. High volume manufacturing (HVM) source repetition rates may be of the order of 10 Khz, which is a period of 100 μs, with an individual pulse event lasting less than 1 μs. Thus more than 99 microseconds may be available between pulses to produce the secondary plasma. The secondary plasma may be triggered to occur between source pulses, minimizing interference with the source discharge. In some embodiments, this may not be necessary. For example, in an embodiment the secondary plasma may be left on during and between source pulses.

A pressure gradient may be established on either side of the foil trap to allow for a high gas pressure on the source side, to help stop debris, and a lower pressure on the collector side, to minimize absorption of EUV. In an embodiment, the foil trap geometry, inlet gas flow, and vacuum pumping may be chosen to optimize the post-collector pressure for the RF plasma, while still maintaining a minimal amount of EUV absorption.

In an embodiment, the coil 225 may be operated at an overall DC bias to produce an axial magnetic field. This may deflect the path of an ion or debris particle so that it travels in a generally circular or spiral path, making it more likely to strike the plates of the foil trap. This may be especially useful when operating the source in a low-pressure environment, where debris particles are less likely to be deflected by the background gas.

Figure 3:
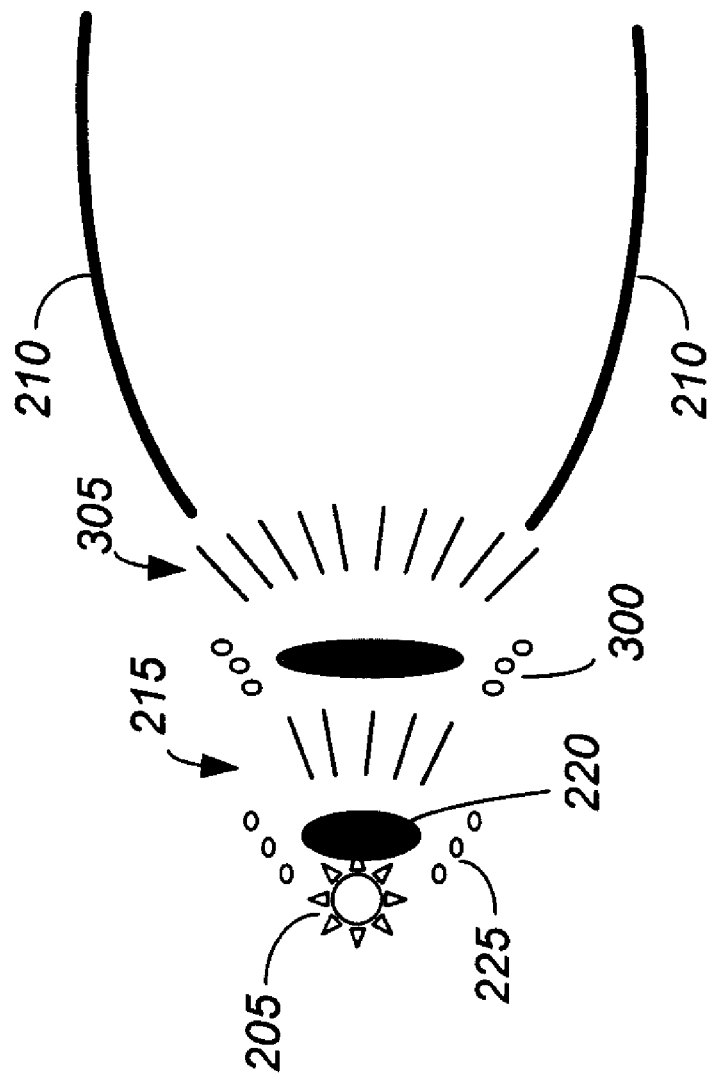
FIG. 3 shows components in a light source chamber according to an alternative embodiment of the invention.

As shown in FIG. 3, an additional (secondary) coil 300 may be positioned immediately after the foil trap to re-ionize any debris that makes it through the trap or that is re-emitted by the trap. An additional foil trap 305 may be positioned between the secondary coil 300 and the collector mirrors to trap the re-ionized and re-emitted debris.

In an embodiment, the electrode surface may be coated with a material that is easily ionizable. For example, a tungsten electrode may be coated with an alkali metal coating, e.g., cesium (Cs). More of the cesium debris particles may become ionized than would tungsten debris particles, and hence more of the cesium debris particles may be captured by the foil traps.

The electrode surface may be coated with a material that is easily ablated. This may assist in the cooling of the electrode, as heat energy would be carried away by the vaporization of the material. Again, alkali metal coatings, e.g., cesium, may be used.

The elements of the foil trap itself may be operated in a miniature plasma mode, either as a DC or at an RF potential driven by a power supply to produce a secondary plasma for ionizing debris particles. This would serve to both ionize particles as well as to draw them to a plate in the foil trap.

The plasma debris mitigation technique may be applied to other uses where debris needs to be blocked from a discharge-produced plasma device, e.g., lithography using wavelengths besides EUV and other areas where a high current is driven through electrodes in a vacuum and the resultant debris needs to be blocked.

A number of embodiments have been described. Nevertheless, it will be understood that various modifications may be made without departing from the spirit and scope of the invention. For example, the ionization might be assisted by a laser pulse focused onto the region to be ionized. Accordingly, other embodiments are within the scope of the following claims.

The invention claimed is:

1. An apparatus comprising:
a plasma produced light source;
one or more collector optics;
a contaminant trap between the light source and the one or more collector optics;
a plasma generating device including an antenna having a coil the plasma generating device operative to prevent debris from reaching the one or more collector optics; and
a second coil between the contaminant trap and the collector optics.

2. The apparatus of claim 1, wherein the light source comprises an extreme-ultraviolet (EUV) light source.

3. The apparatus of claim 1, wherein the plasma generating device coil is an RF coil operative to produce an inductively coupled plasma.

4. The apparatus of claim 1, further comprising means for minimizing sputtering of the plasma generating device coil.

5. The apparatus of claim 4, further comprising a Faraday shield disposed about the coil in the plasma generating device to minimize sputtering of the coil in the plasma generating device.

6. The apparatus of claim 1, further comprising:
an electromagnetic field generating device to attract the ionized debris particles toward the contaminant trap.

7. The apparatus of claim 6, wherein the contaminant trap comprises a plurality of foil elements.

8. The apparatus of claim 1, the further comprising a power supply connected to the plasma generating device coil.

9. The apparatus of claim 8, wherein the power supply is operative to supply radio frequency (RF) power.

10. The apparatus of claim 8, wherein the power source is operative to supply direct current (DC) power.

11. The apparatus of claim 1, wherein the light source comprises electrodes.

12. The apparatus of claim 11, wherein the electrodes comprise a first material and are coated by a second material.

13. The apparatus of claim 12, wherein the second material is more easily ionized than the first material.

14. The apparatus of claim 12, wherein the second material is more easily ablated than the first material.

15. The apparatus of claim 12, wherein the first material comprises a tungsten alloy and the second material comprises an alkali metal.

16. The apparatus of claim 15, wherein the alkali metal is cesium.

17. The apparatus of claim 15, wherein the alkali metal is lithium.

18. The apparatus of claim 1, wherein the second coil is operative to ionize debris particles that pass the contaminant trap.

19. A method comprising:
ionizing debris particles generated by a plasma producing light source in a lithography system;
diverting the ionized debris particles away from collector optics in the lithography system; wherein diverting comprises effecting the path of the ionized debris particles toward a contaminant trap between the light source and collector optics in the lithography system; and
moving remaining ionized debris particles between the contaminant trap and the collector optics away from the collector optics, with a plasma generating device.

20. The method of claim 19, wherein said diverting comprises:
producing a potential difference between elements in the contaminant trap.

21. The method of claim 19, wherein said ionizing comprises:
generating a secondary plasma between the light source and the collector optics.

22. The method of claim 21, wherein said generating secondary plasma comprising generating a plasma by inductive coupling to minimize self-biasing.

23. The method of claim 22, wherein Faraday shields are used to minimize self-biasing.

24. The method of claim 21, wherein said generating the secondary plasma comprises:
providing radio frequency (RF) power to a coil between the light source and the contaminant trap.

25. The method of claim 19, further comprising:
generating extreme ultraviolet (EUV) radiation with the light source.

26. A system comprising:
a light source chamber including
a plasma produced light source, one or more collector optics, a contaminant trap between the light source and the one or more collector optics, and a first plasma generating device operative to effect removal of matter between the light source and the contaminant trap from reaching the one or more collector optics by diverting the matter toward the contaminant trap;

a second plasma generating device operative to effect removal of matter between the contaminant trap and the collector optics from reaching the one or more collector optics; and a lithography chamber connected to the light source chamber.

27. The system of claim 26, wherein the light source comprises an extreme-ultraviolet (EUV) light source.

28. The system of claim 27, wherein the first plasma generating device comprises an antenna.

29. An apparatus comprising:
a light chamber including
a plasma produced light source in a light chamber;
one or more collector optics,
a contaminant trap between the light source and the one or more collector optics,
a first plasma generating device operative to ionize debris in the light chamber between the light source and the contaminant trap; and
a second plasma generating device operative to effect removal of matter between the contaminant trap and the collector optics from reaching the one or more collector optics.

30. The apparatus of claim 29, wherein the light source comprises an extreme-ultraviolet (EUV) light source.

31. The apparatus of claim 29, wherein the first plasma generating device comprises an antenna.

32. The apparatus of claim 31, wherein the antenna comprises an RF coil to produce an inductively coupled plasma.

* * * * *